(12) United States Patent
Barr et al.

(10) Patent No.: US 7,079,390 B2
(45) Date of Patent: Jul. 18, 2006

(54) SYSTEM AND METHOD FOR HEAT DISSIPATION AND AIR FLOW REDIRECTION IN A CHASSIS

(75) Inventors: Andrew Harvey Barr, Roseville, CA (US); Stephan Karl Barsun, Davis, CA (US); Robert William Dobbs, Granite Bay, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 219 days.

(21) Appl. No.: 10/456,671

(22) Filed: Jun. 5, 2003

(65) Prior Publication Data
US 2004/0246676 A1  Dec. 9, 2004

(51) Int. Cl.
*H05K 7/20* (2006.01)

(52) U.S. Cl. ............... 361/690; 361/697; 361/703; 165/80.3; 257/697

(58) Field of Classification Search ............... 361/683, 361/687–699, 702–712, 717–719, 722–724, 361/756, 775; 257/697, 706–727; 165/80.2, 165/80.3, 121–126, 104.33, 104.34, 165, 165/185; 454/184; 174/16.03, 252, 16.3, 174/16.1, 15.1, 15.2
See application file for complete search history.

(56) References Cited

U.S. PATENT DOCUMENTS

| | | | | | |
|---|---|---|---|---|---|
| 3,592,260 A | * | 7/1971 | Berger | ................ | 165/121 |
| 4,733,293 A | * | 3/1988 | Gabuzda | ................ | 257/697 |
| 5,000,254 A | * | 3/1991 | Williams | ................ | 165/85 |
| 5,582,240 A | * | 12/1996 | Widmayer | ................ | 165/80.3 |
| 5,785,116 A | * | 7/1998 | Wagner | ................ | 165/80.3 |
| 6,113,485 A | * | 9/2000 | Marquis et al. | ................ | 454/184 |
| 6,196,300 B1 | * | 3/2001 | Checchetti | ................ | 165/80.3 |
| 6,418,020 B1 | * | 7/2002 | Lin | ................ | 361/703 |
| 6,421,239 B1 | * | 7/2002 | Huang | ................ | 361/696 |
| 6,657,862 B1 | * | 12/2003 | Crocker et al. | ................ | 361/697 |
| 6,671,172 B1 | * | 12/2003 | Carter et al. | ................ | 361/697 |
| 6,698,511 B1 | * | 3/2004 | DiBene et al. | ................ | 165/185 |
| 6,778,390 B1 | * | 8/2004 | Michael | ................ | 361/695 |
| 6,847,525 B1 | * | 1/2005 | Smith et al. | ................ | 361/703 |
| 2002/0046826 A1 | * | 4/2002 | Kao | ................ | 165/104.33 |
| 2002/0170702 A1 | * | 11/2002 | Ito | ................ | 165/80.2 |

FOREIGN PATENT DOCUMENTS

| EP | 1 202 346 A1 | * | 2/2002 |
| JP | 01133338 A | * | 5/1989 |
| JP | 10012781 A | * | 6/1996 |

* cited by examiner

Primary Examiner—Michael Datskovskiy

(57) ABSTRACT

An apparatus for heat dissipation in a chassis housing an electronic system, and a method for implementing the same. The apparatus comprises a heat sink base for collecting thermal heat. The apparatus further comprises a fin thermally coupled to the heat sink base for dissipating the thermal heat. The fin is arranged in the chassis to direct air flow from a first direction, that is originally directed at said fin, to a second direction.

13 Claims, 10 Drawing Sheets

SYSTEM AND METHOD FOR HEAT DISSIPATION AND AIR FLOW REDIRECTION IN A CHASSIS

TECHNICAL FIELD

The present invention relates to the field of server computers. More particularly, the present invention relates to the field of heat dissipation in densely packed server chassis.

BACKGROUND ART

The trend in server computers is towards packaging more and more processors in smaller and smaller server chassis. Densely packed (e.g., ultrathin) designs for server computers allow for more computing power to be available in the chassis of similar dimension. For example, current server computers of dimension 1U (1.75 inches) are available and can be stacked 42 server computers to a rack. In the future, servers are expected to get even denser and pack many more than 42 to a rack.

However, a problem associated with more powerful server computers is heat dissipation. By increasing the computing power of server computers, faster central processing units (CPUs) must be used. Typically, the faster the CPU, the hotter the CPU operates. One method of cooling the CPU is typically accomplished by passing air over the CPU or a heat sink with fins that is thermally coupled to the CPU. For server computers that are unconcerned with interior space of a server computer chassis, cooling is not an issue. However, thinner and thinner server designs leave less space within the server chassis to put cooling elements for dissipating the heat generated by the CPU or CPUs.

Moreover air flow within a server computer chassis is important for dissipating heat generated within the server chassis in the most efficient manner. Prior Art FIG. 1 is a top-view of a system 100 for dissipating heat within a server computer. System 100 is contained within a server computer chassis. System 100 comprises a heat sink base 110 and a plurality of fins 120. The heat sink base 110 is thermally coupled to a heat source, such as, one or more CPUs, and acts as a collector of heat generated from the CPUs. The plurality of fins 120 is thermally coupled to the heat sink base 110, and is used for dissipating the thermal heat collected by the heat sink base 110.

As shown in Prior Art FIG. 1, the surface of the heat sink base 110 lies on a two dimensional plane along the x-axis and y-axis. The movement of air flow 130 is directed at the system 100 along the y-axis. Each of the plurality of fins 120 is arranged on the surface of the heat sink 110 in the vertical plane, along the z-axis and the y-axis. As such, each of the plurality of fin 120 comes out of the page and extends up and down the page along the y-axis.

In Prior Art FIG. 1, a barrier structure 140 is also arranged within the server computer chassis. The barrier structure 140 lies directly behind the heat sink base 110 along the y-axis. The barrier 140, depending on its size and distance away from the heat sink base 110 can deleteriously block the movement of the air flow 130 across the plurality of fins 120, thereby reducing the efficiency of the plurality of fins 120 in heat dissipation. Also, the barrier 140 can effect the movement of the air flow 130 after encountering the heat sink base 110. As such, the barrier 140 can reduce or eliminate the movement of the air flow 130, thereby reducing the further cooling effect of the air flow 130.

In one solution in the prior art, air flow 130 can be redirected within the server chassis using additional baffling structures that are discrete pieces of sheet metal to avoid the barrier 140. As such, the movement of air flow 130 is redirectd to avoid the barrier 140 and possibly pass over a second element 150. The second element 150 may necessarily be located in a predesignated position in relation to the heat sink base 110 due to electrical constraints of the printed circuit board containing the CPU or CPUs of the server computer.

Another solution of the prior art calls for the addition of supplemental forced air sources, such as, blowers, axial fans, and impingement fans, etc. to direct air over the second element 150. However, additional baffling or supplemental forced air sources in an already tight server chassis would add additional cost, and waste critical space resources that are necessary for increasing the computing power of the server computer chassis, and for reducing the overall size of the server chassis. As a result, the performance of the server computer would be reduced due to inefficient dissipation of thermal heat that is generated within the server computer chassis.

Therefore, prior art methods of implementing barriers and supplemental forced air sources to redirect air flow within a server computer chassis for heat dissipation does not promote the reduction of the overall size of the server chassis.

DISCLOSURE OF THE INVENTION

An apparatus for heat dissipation in a chassis housing an electronic system, and a method for implementing the same are disclosed. The apparatus includes a heat sink base for collecting thermal heat. The apparatus further includes a fin thermally coupled to the heat sink base for dissipating the aforementioned thermal heat. The fin is arranged in the chassis to direct air flow from a first direction, that is originally directed at the fin, to a second direction. In this way, the fin provides the dual function of dissipating thermal heat and redirection of air flow.

BRIEF DESCRIPTION OF THE DRAWINGS

PRIOR ART

BEST MODES FOR CARRYING OUT THE INVENTION

Reference will now be made in detail to the preferred embodiments of the present invention, a system and method of heat dissipation and the redirection of air flow within a chassis housing an electrical system. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a system and method for heat dissipation and air flow redirection. Specifically, embodiments of the present invention disclose a system that dissipates heat within a chassis that houses an electronic system and redirects air flow within the chassis, and a method for implementing the same. Because the system combines the functionality of heat dissipation and air flow redirection in a plurality of fins, embodiments of the present invention are superior to previous techniques in the prior art that failed to dissipate heat within smaller chassis in an efficient manner. As such, embodiments of the present invention are able to further reduce the size of the chassis beyond those of the prior art because of more efficient cooling techniques. More specifically, embodiments of the present invention are able to provide high thermal efficiency by improving overall heat dissipation in smaller chassis. This is accomplished by eliminating the need for additional parts, such as, baffling, to provide air flow redirection, and by providing a means for redirecting air flow around barrier structures that interfere with the efficient movement of air flow within the chassis.

Figure 1:
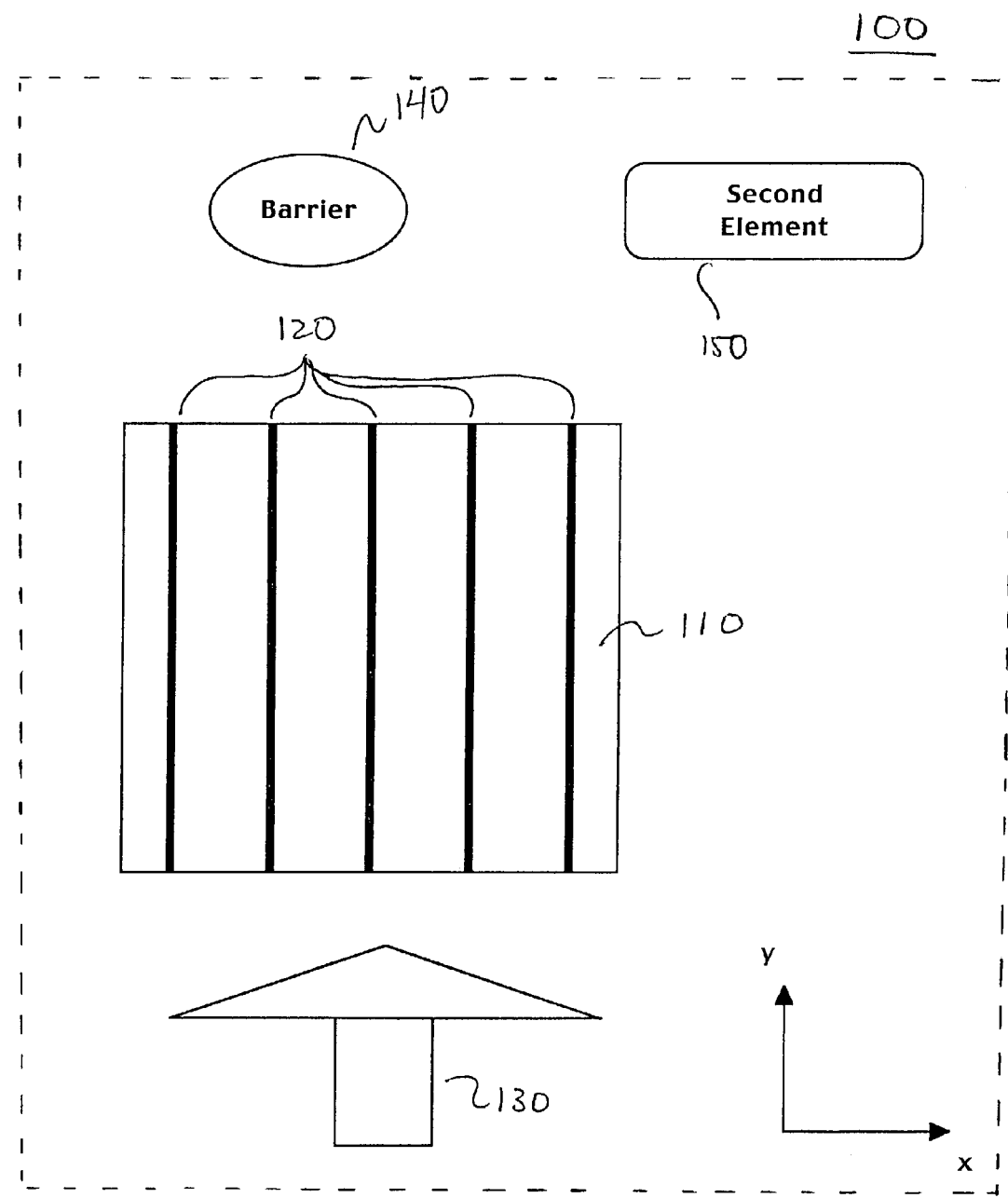
FIG. 1 is a top-down view of a heat sink base and a plurality of fins that promote the inefficient movement of air flow across the heat sink base and through a server computer chassis.
Figure 2A:
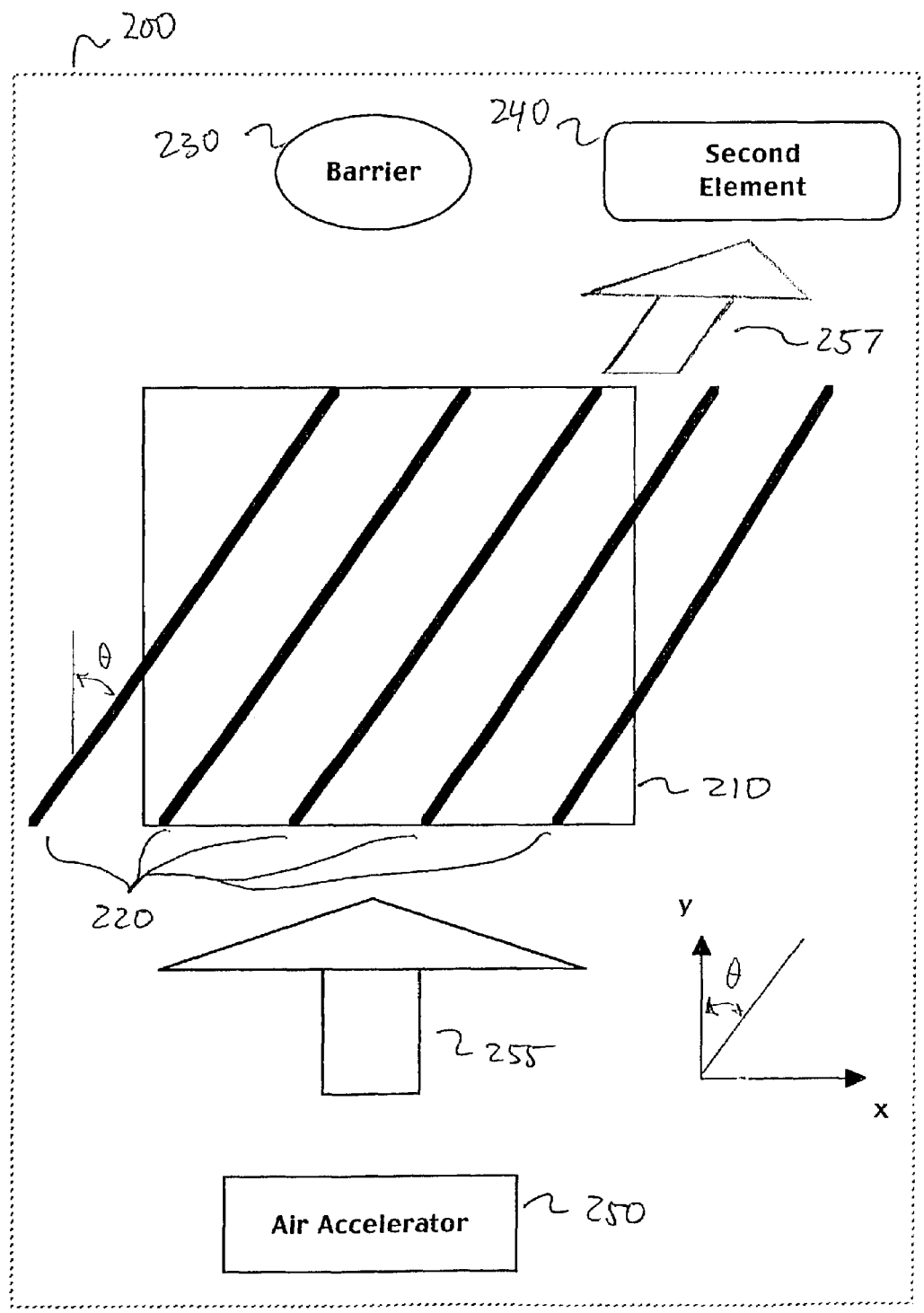
FIG. 2A is a top-down view of a heat sink base and a plurality of linearly shaped fins that are capable of redirecting air flow from a first direction to a second direction in two dimensions, in accordance with one embodiment of the present invention.

FIG. 2A is a schematic diagram illustrating a top-down view of components contained within a system 200 that is contained within a chassis that houses an electronic system, such as, a server computer, in accordance with one embodiment of the present invention. The system 200 is implemented within a densely packed environment (e.g., an ultra-thin environment) in which air flow or the movement of air within the chassis is important to facilitate the dissipation of thermal heat generated by components in the system.

System 200 comprises a heat sink base 210 and a plurality of fins 220. The heat sink base 210 is thermally coupled to a heat source, such as, one or more CPUs, and acts as a collector of heat generated from the one or more CPUs. The plurality of fins 220 is thermally coupled to the heat sink base 210, and is used for dissipating the thermal heat collected by the heat sink base 210.

In one embodiment, the plurality of fins 220 is directly coupled to the heat sink base for increased efficiency of thermal dissipation. In addition, FIG. 2A is used for illustrative purposes only, in that the density, height, and size of each of the plurality of fins are varied depending on the performance characteristics desired, in embodiments of the present invention.

As shown in FIG. 2A, the surface of the heat sink base 210 lies on a two dimensional plane along the x-axis and y-axis. An air source, or air accelerator 250 (e.g., axial fan, blower, etc.) accelerates and generates air flow 255. The movement of air flow 255 coming from the air accelerator 250 is originally directed at the heat sink base 210 and the plurality of fins 220 in a first direction, the y-direction.

Within the system 200 contained within the chassis is a barrier structure 230 and a second element 240. The barrier structure 230 is located directly behind the heat sink base 210 and the plurality of fins 220 in the y-direction. As such, unless addressed, the barrier structure 230 could potentially pose a problem in the overall movement of the air flow 255 through chassis that houses the electronic system, including the system 200. The barrier 230, depending on its size and distance away from the heat sink base 210 can deleteriously block the movement of air flow 255 across the plurality of fins 220, thereby reducing the efficiency of the plurality of fins 220 in heat dissipation. Also, the barrier 230 could effect the movement of air flow 255 after encountering the heat sink base 210. As such, unless addressed, the barrier 230 could reduce or eliminate the movement of air flow 255, thereby reducing the further cooling effect of air flow 255.

In addition, the system 200 comprises a second element 240 that is located remotely from the heat sink base 210 and plurality of fins 220. The location of the second element within the chassis in relation to the heat sink base 210, the plurality of fins 220, and the air accelerator 250 could be dictated by the electrical constraints of the components contained within the chassis that houses an electrical system, such as, a printed circuit board that comprises electrical components such as one or more CPUs. As such, the second element is not within the path of the air flow 255.

The second element generates thermal heat of which heat dissipation is required. The second element, in one embodiment, also comprises a second heat sink base and a second plurality of fins for dissipating thermal heat collected or generated by the second element. In the present embodiment, the plurality of fins 220 is arranged within the system 200 and the chassis that houses system 200 to redirect air flow 255 over the second element. More specifically, the plurality of fins 220 is arranged to redirect air flow 255 from a first direction (the y-direction) to a second direction that is offset from the y-direction by the angle θ. As such, redirected air flow 257 is directed towards the second element 240.

Each of the plurality of fins 220 is arranged in relation to the heat sink base 210 offset from the y-axis by the angle θ in the x-y plane in order to redirect air flow 255 from a first direction to the second direction. As such, each of the plurality of fins 220 provides a dual functionality by dissipating heat collected by the heat sink base 210 and redirecting air flow 255 in a second direction. As such, redirected air flow 257 is directed at the second element 240.

In addition, redirected air flow 257 bypasses the barrier structure 230. As such, the overall air flow through the chassis that houses the electronic system, including system 200, is not obstructed, and can more efficiently dissipate thermal heat generated by the electronic components within the chassis, including system 200. In particular, air flow 255 is unobstructed and can dissipate the thermal heat collected in heat sink base 210 more efficiently.

By designing a heat sink with an additional feature of air flow direction, no additional parts are necessary within the design of the electrical system in a chassis. For example, no additional baffling is required to redirect air flow through the chassis. Instead, by providing the plurality of fins of a heat sink with the additional feature of air flow redirection, more and more processors can be placed within a particularly sized chassis (e.g., a 1U chassis). Also, space is gained by providing the plurality of fins that provide heat dissipation and air flow redirection, so that, the overall size of an electronic system, and the chassis that houses the electronic system is decreased.

Figure 2B:
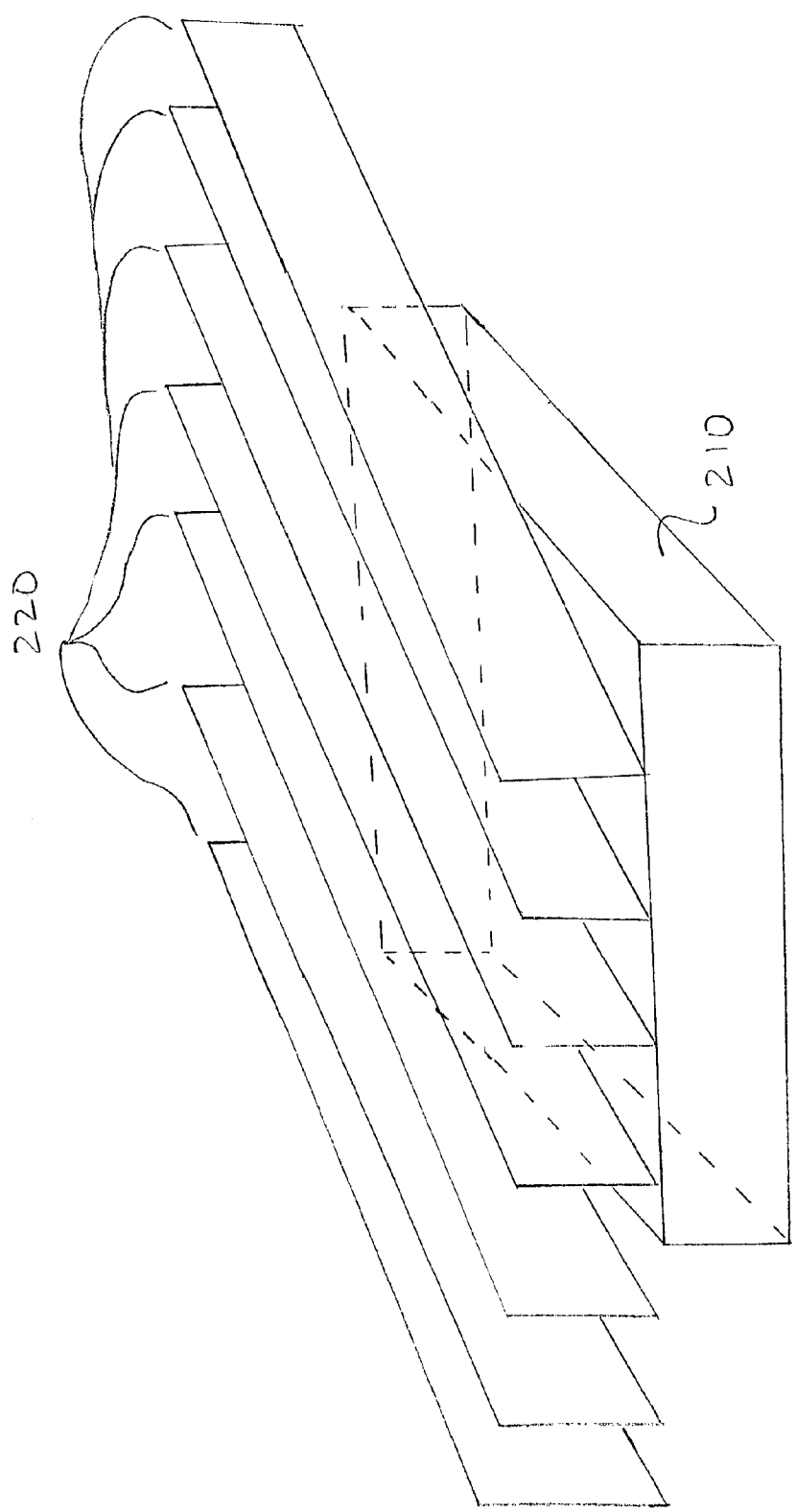
FIG. 2B is a side view of the heat sink base and the plurality of linearly shaped fins of FIG. 2A that are capable of redirecting air flow from a first direction to a second direction in two dimensions, in accordance with one embodiment of the present invention.

FIG. 2B is a three-dimensional view of the heat sink base 210 and the plurality of fins 220 of FIG. 2A. As shown in FIG. 2B, the heat sink base 210 is thermally coupled to the plurality of fins 220. In the present embodiment, each of the plurality of fins 220 is linearly shaped. That is, each of the plurality of fins 220 is planar in structure.

In one embodiment, each of the plurality of fins 220 is of the same length. As such, the fins may extend beyond the surface of the heat sink base 210 so that each of the fins are presented with an unobstructed interface with the air flow 255. Because each of the plurality of fins 220 is equally shaped, the air flow 255 in the first direction impinges upon each of the plurality of fins 220 equally to promote an equal distribution of the air flow 255.

While the present embodiment, as shown in FIG. 2B, illustrates fins of equal length, other embodiments of the preset invention are well suited to having fins of disproportionate lengths, depending on the angle needed for redirecting the air flow 255 to the second direction. For smaller angles of θ, there is less of a need to extend the fins beyond the surface of the heat sink base 210.

Figure 3A:
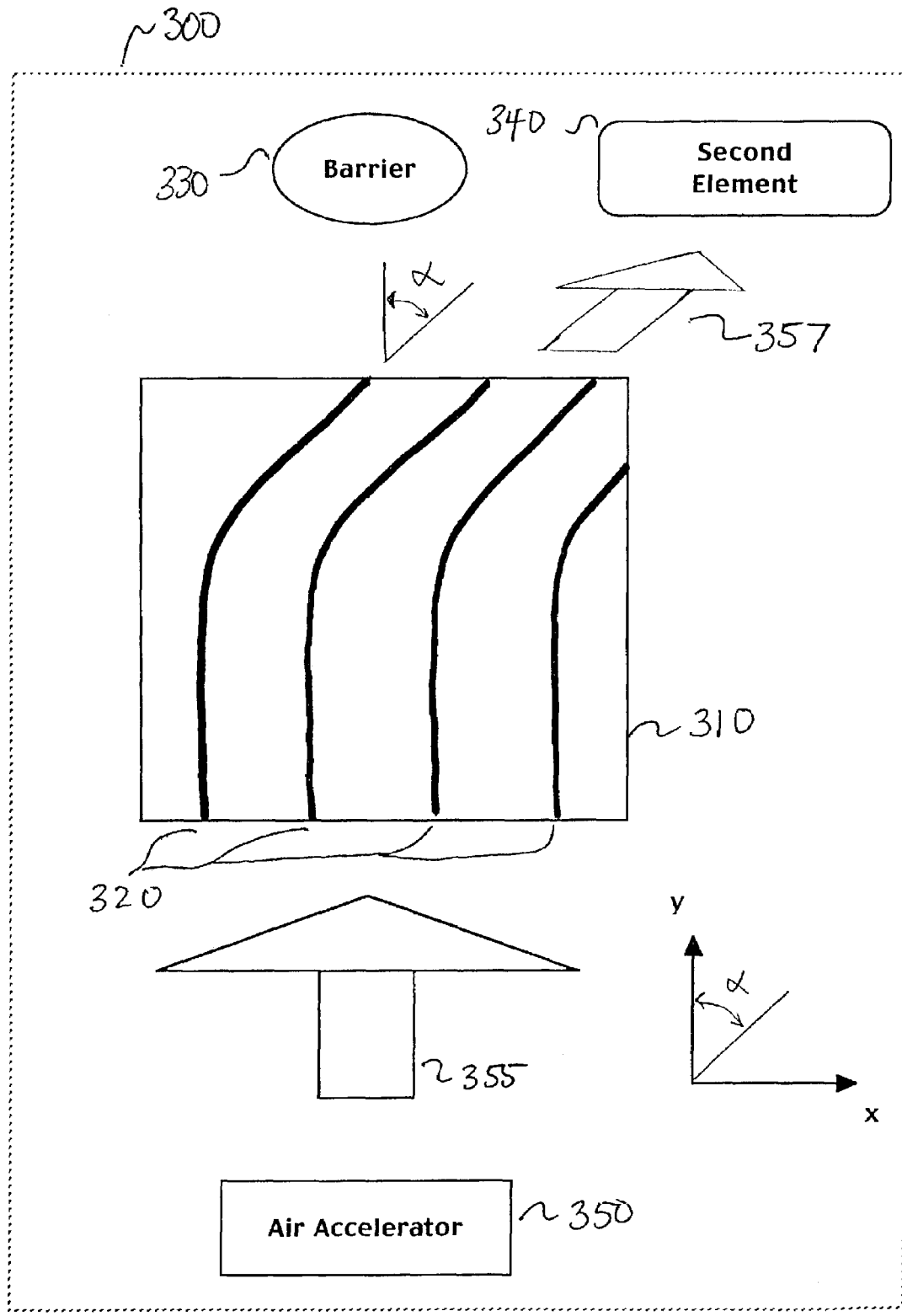
FIG. 3A is a top-down view of a heat sink base and a plurality of curvilinearly shaped fins that are capable of redirecting air flow from a first direction to a second direction in two dimensions, in accordance with one embodiment of the present invention.

FIG. 3A is a schematic diagram illustrating a top-down view of components contained within a system 300 that is contained within a chassis that houses an electronic system, such as, a server computer, in accordance with one embodiment of the present invention. The system 300 is implemented within a densely packed environment as described previously in full. Air flow or the movement of air within the chassis is important to facilitate the dissipation of thermal heat generated by components in the system 300.

FIG. 3A is a top-down view of a heat sink base 310 and a plurality of curvilinearly shaped fins 320 that are capable of redirecting air flow from a first direction to a second direction in two dimensions. The heat sink base 310 is thermally coupled to a heat source, such as, one or more CPUs, and acts as a collector of heat generated from the one or more CPUs. The plurality of fins 320 is thermally coupled to the heat sink base 310, and is used for dissipating the thermal heat collected by the heat sink base 310.

In one embodiment, the plurality of fins 320 is directly coupled to the heat sink base for increased efficiency of thermal dissipation. In addition, FIG. 3A is used for illustrative purposes only, in that the density, height, and size of each of the plurality of fins are varied depending on the performance characteristics desired, in embodiments of the present invention.

As shown in FIG. 3A, the surface of the heat sink base 310 lies on a two dimensional plane along the x-axis and y-axis. An air source, or air accelerator 350 accelerates and generates air flow 355. The movement of air flow 355 coming from the air accelerator 350 is originally directed at the heat sink base 310 and the plurality of fins 320 in a first direction, the y-direction.

Within the system 300 contained within the chassis that houses an electronic system (e.g., a server computer) is a barrier structure 330 and a second element 340. The barrier structure 330 is located directly behind the heat sink base 310 and the plurality of fins 320 in the y-direction. As such, unless addressed, the barrier structure 330 could potentially pose a problem in the overall movement of the air flow 355 through the chassis that houses the system 300, as similarly and previously described in the discussion related to the barrier structure 230 of FIGS. 2A and 2B. As such, unless addressed, the barrier 330, can reduce or eliminate the movement of air flow through the chassis, thereby reducing the efficiency of thermal dissipation of the plurality of fins 320, and its further cooling effect for other components in the chassis.

In addition, the system 300 comprises a second element 340 that is located remotely from the heat sink base 310 and plurality of fins 320. The location of the second element 340 within the chassis in relation to the heat sink base 310, the plurality of fins 320, and the air accelerator 350 could be dictated by the electrical constraints of the components contained within the chassis that houses an electrical system, such as, a printed circuit board that comprises electrical components such as one or more CPUs, especially as the size of the chassis increasingly becomes smaller.

The second element 340 generates thermal heat of which heat dissipation is required. The second element 340 in one embodiment also comprises a second heat sink base and a second plurality of fins for dissipating thermal heat collected or generated by the second element. In the present embodiment, the plurality of fins 320 is arranged within the system 300 and the chassis that houses system 300 to redirect air flow 355 over the second element. More specifically, the plurality of fins 320 is arranged to redirect air flow 355 from a first direction (the y-direction) to a second direction that is offset from the y-direction by the angle α. Because of its curvilinear shape, the air flow 355 can be redirected at angles α less than ninety degrees. As such, redirected air flow 357 is directed towards the second element 340.

As shown in FIG. 3A, each of the plurality of fins 320 is curvilinearly shaped. Initially, each of the plurality of fins 320 lies in the direction of the y-axis, and the direction of air flow 355. Thereafter, each of the plurality of fins 320 gradually curves to redirect the air flow 355 to a second direction towards the second element 340. As such, redirected air flow 357 flows in a second direction at an angle α relative to the first direction of air flow 355 in the x-y plane.

The curvilinear shape of the plurality of fins 320 aids in redirecting air flow to a second direction that is offset from a first direction by more extreme angles (e.g., greater than forty-five degrees). By providing a curvilinear shape, less space is needed than the linearly shaped plurality of fins in that the curvilinear fins need not extend beyond the surface of the heat sink base 310 to provide an even distribution of the air flow 355. The curvilinear fins each have an unobstructed interface with the air flow 355.

In addition, redirected air flow 357 bypasses the barrier structure 330. As such, the overall air flow through the chassis that houses the electronic system, including system 300, is not obstructed, and can more efficiently dissipate thermal heat generated by the electronic components within the chassis, including system 300. In particular, air flow 355 is unobstructed and can dissipate the thermal heat collected in heat sink base 310 more efficiently.

The advantages of the plurality of fins 320 are similar to the fin design of the plurality of fins 220. By designing a heat sink with an additional feature of air flow direction, no additional parts are necessary within the design of the electrical system in a chassis. For example, no additional baffling is required to redirect air flow through the chassis. Instead, by providing the plurality of fins of a heat sink with the additional feature of air flow redirection, more and more processors can be placed within a particularly sized chassis (e.g., a 1U chassis). Also, space is gained by providing the plurality of fins that provide heat dissipation and air flow redirection, so that, the overall size of an electronic system, and the chassis that houses the electronic system is decreased.

Figure 3B:
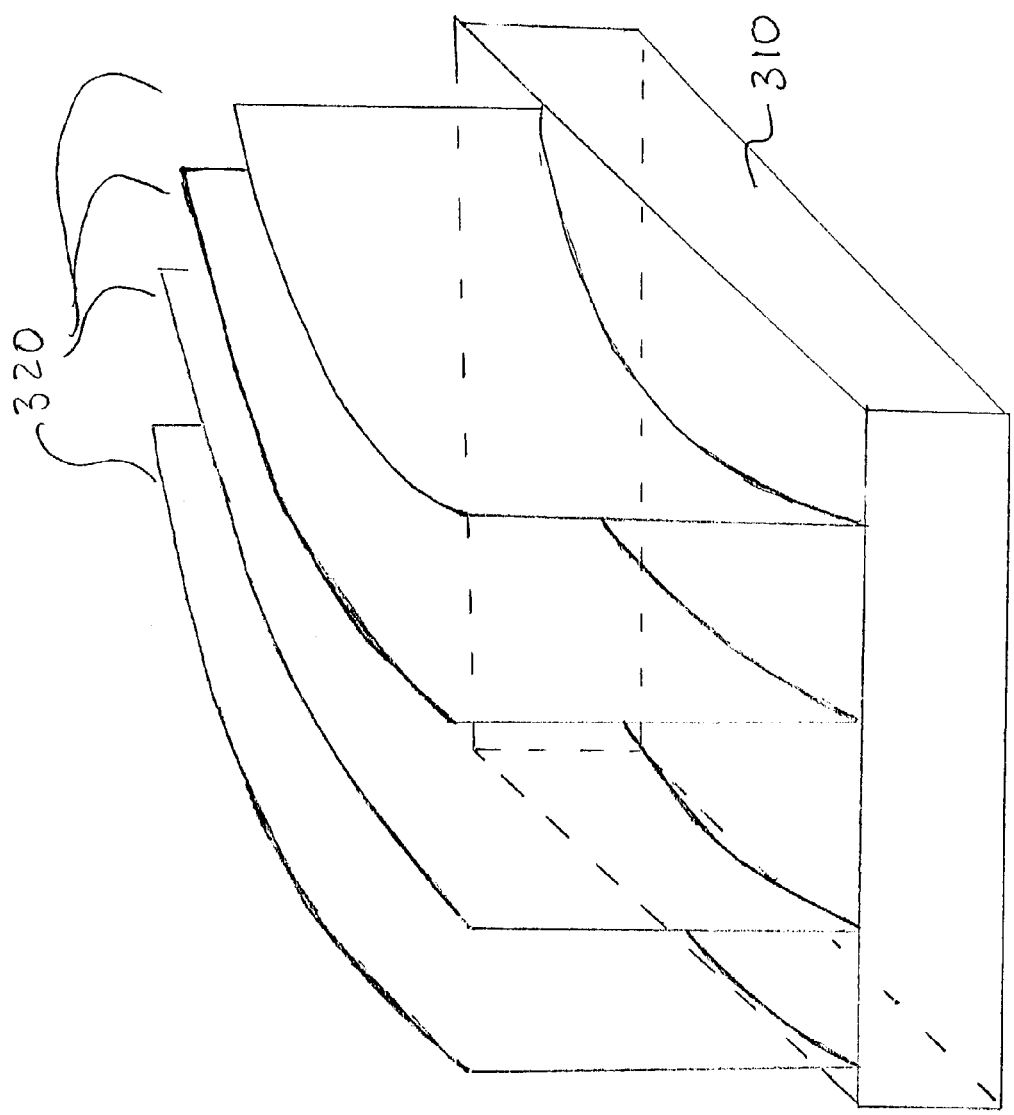
FIG. 3B is an oblique view of the heat sink base and the plurality of curvilinearly shaped fins of FIG. 3A that are capable of redirecting air flow from a first direction to a second direction in two dimensions, in accordance with one embodiment of the present invention.

FIG. 3B is a three-dimensional view of the heat sink base 310 and the plurality of fins 320 of FIG. 3A. As shown in FIG. 3B, the heat sink base 310 is thermally coupled to the plurality of fins 320. In the present embodiment, each of the plurality of fins is curvilinearly shaped. That is, each of the plurality of fins 320 is curved in structure. The shape of each of the plurality of fins 320 beyond its curved structure is varied depending on the performance characteristics desired. Because each of the plurality of fins 320 initially starts out in the y-direction, the air flow 355 in the first direction impinges upon each of the plurality of fins 320 equally to promote an equal distribution of the air flow 355. In addition, spacing between each of the plurality of fins 320 is equal to avoid pressure increases and pressure drops which lead to inefficient airflow, in one embodiment.

In addition, FIG. 3B is used for illustrative purposes only, in that the density, height, and size of each of the plurality of fins 320 are varied depending on the performance characteristics desired, in embodiments of the present invention.

Figure 4:
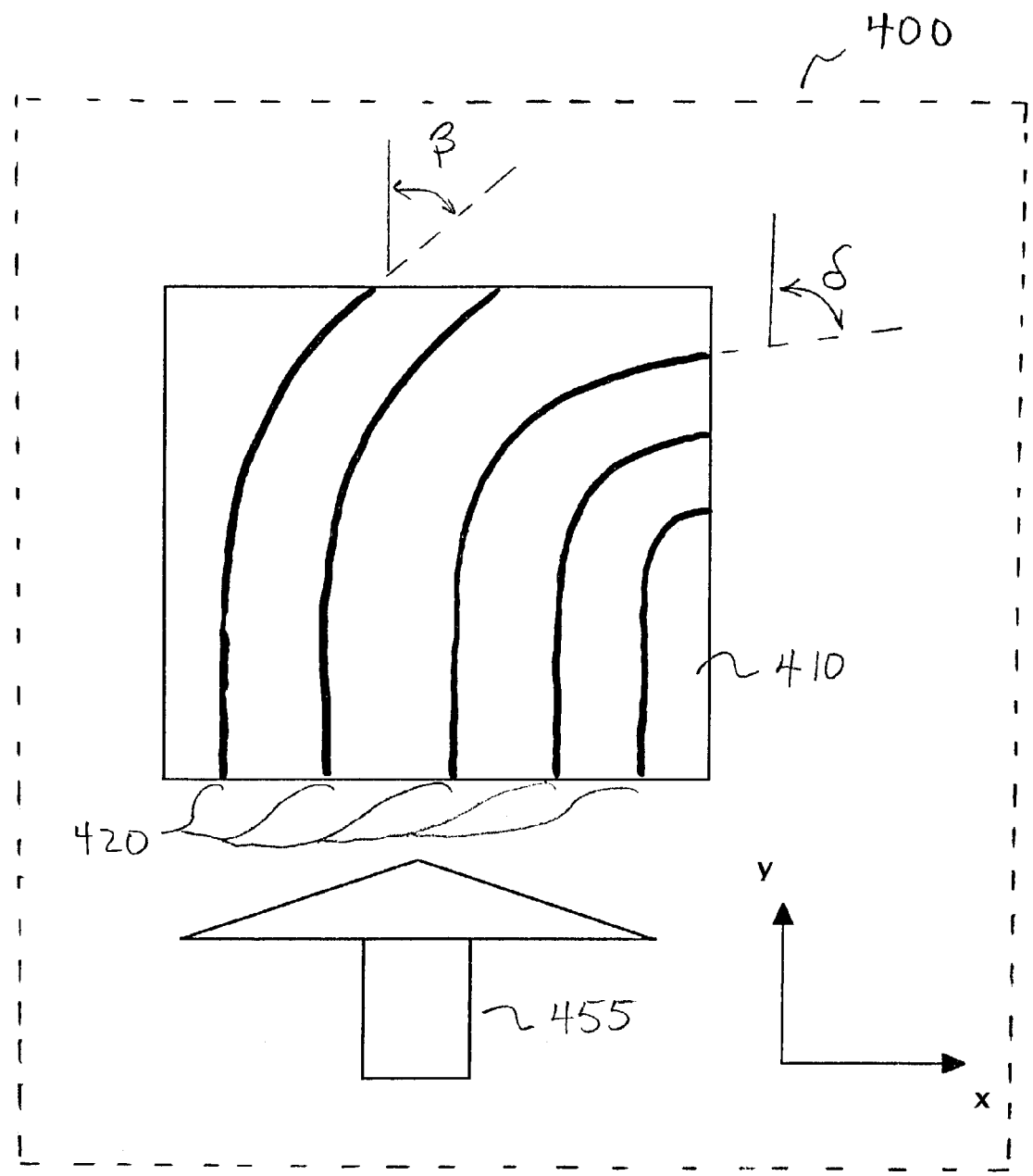
FIG. 4 is a top-down view of a heat sink base and a plurality of curvilinearly shaped fins that are capable of redirecting air flow from a first direction to a plurality of varying directions in two dimensions, in accordance with one embodiment of the present invention.

FIG. 4 is a schematic diagram illustrating a top-down view of components contained within a system 400 that is contained within a chassis that houses an electronic system, such as, a server computer, in accordance with one embodiment of the present invention. The system 400 is implemented within a densely packed environment as described previously in full. Air flow or the movement of air within the chassis is important to facilitate the dissipation of thermal heat generated by components in the system 400.

The heat sink base 410 of system 400 is thermally coupled to a heat source, such as, one or more CPUs, and acts as a collector of heat generated from the one or more CPUs. The plurality of fins 420 is thermally coupled to the heat sink base 410, and is used for dissipating the thermal heat collected by the heat sink base 410.

FIG. 4 illustrates the incorporation of the benefits provided in FIGS. 2A, 2B, 3A, and 3B to provide the redirecting of air flow that impinges upon a heat sink base 410 in a first direction, and is redirected to more than one direction in two dimensions. As shown in FIG. 4, the plurality of fins 420 are curvilinear in shape and redirects the air flow 455 from a first direction, the y-direction, to a second direction that is offset from the first direction by an angle $\beta$, and to a third direction that is offset from the first direction by an angle $\delta$.

The plurality of fins 420 is capable of redirecting the air flow 455 to one or more directions in two dimensions using linear fins, curvilinear fins, or a combination of both. In addition, FIG. 4 is used for illustrative purposes only, in that the density, height, and size of each of the plurality of fins 420 are varied depending on the performance characteristics desired, in accordance with embodiments of the present invention.

Figure 5:
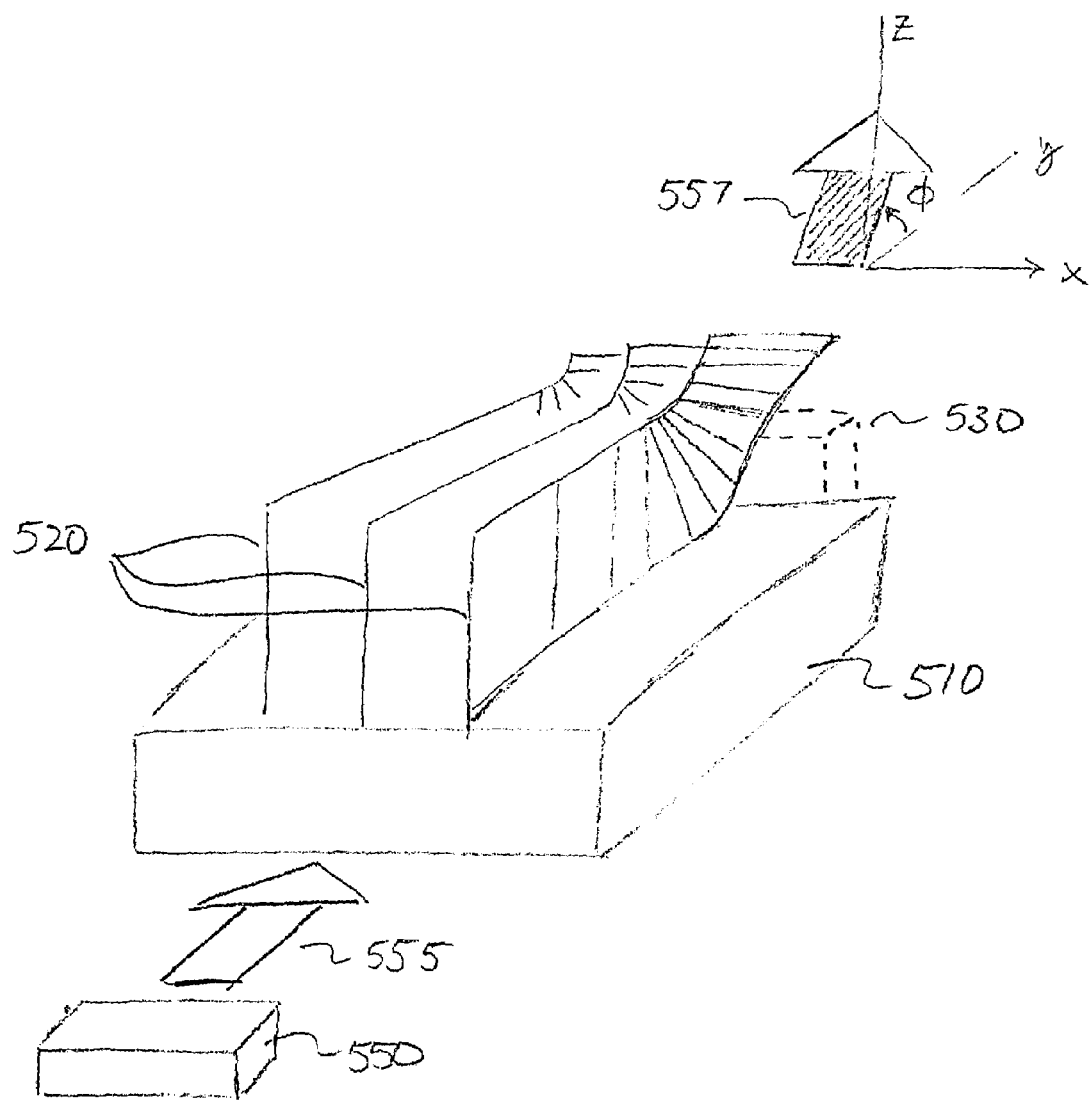
FIG. 5 is an oblique view of a heat sink base and a plurality of curvilinearly shaped fins that are capable of redirecting air flow from a first direction to a second direction in three dimensions, in accordance with one embodiment of the present invention.

FIG. 5 is a schematic diagram illustrating a three-dimensional view of components contained within a system. The system of FIG. 5 is contained within a chassis that houses an electronic system, such as, a server computer, in accordance with one embodiment of the present invention. The system 500 is implemented within a densely packed environment as described previously in full. Air flow or the movement of air within the chassis is important to facilitate the dissipation of thermal heat generated by components in the system 500.

FIG. 5 is an oblique view of a heat sink base 510 and a plurality of curvilinearly shaped fins 520 that are capable of redirecting air flow from a first direction to a second direction in three dimensions. The heat sink base 510 is thermally coupled to a heat source, such as, one or more CPUs, and acts as a collector of heat generated from the one or more CPUs. The plurality of fins 520 is thermally coupled to the heat sink base 510, and is used for dissipating the thermal heat collected by the heat sink base 510.

In one embodiment, the plurality of fins 520 is directly coupled to the heat sink base for increased efficiency of thermal dissipation. In addition, FIG. 5 is used for illustrative purposes only, in that the density, height, shape, and size of each of the plurality of fins 520 are varied depending on the performance characteristics desired.

As shown in FIG. 5, the surface of the heat sink base 510 lies on a two dimensional plane along the x-axis and y-axis. An air source, or air accelerator 550 accelerates and generates air flow 555. The movement of air flow 555 coming from the air accelerator 550 is originally directed at the heat sink base 510 and the plurality of fins 520 in a first direction, the y-direction, as shown.

Within the system 500 contained within the chassis that houses an electronic system (e.g., a server computer) is a barrier structure 530. The barrier structure 530 is located directly behind the heat sink base 510 and the plurality of fins 520 in the y-direction. As such, unless addressed, the barrier structure 530 could potentially pose a problem in the overall movement of the air flow 555 through the chassis that houses the electronic system, including the system 500, as previously described in relation to the barrier structure 230 of FIGS. 2A and 2B. As such, unless addressed, the barrier 530, can reduce or eliminate the movement of air flow through the chassis, thereby reducing the efficiency of thermal dissipation of the plurality of fins 520, and its further cooling effect for other components in the chassis.

As shown in FIG. 5, each of the plurality of fins 520 is curvilinearly shaped. Initially, each of the plurality of fins 520 lies in the direction of the y-axis, and the direction of air flow 555. Thereafter, each of the plurality of fins 520 gradually curves to redirect or translate the air flow 555 to a second direction in the z-direction over the barrier structure 530. As such, redirected air flow 557 flows in a second direction at an angle $\alpha$ in the y-z plane relative to the first direction of air flow 555.

The curvilinear shape of the plurality of fins 520 aids in redirecting air flow to a second direction over barrier structures. As such, the overall air flow through the chassis that houses the electronic system, including system 500, is not obstructed, and can more efficiently dissipate thermal heat generated by the electronic components within the chassis, including system 500. In particular, air flow 555 is unobstructed and can dissipate the thermal heat collected in heat sink base 510 more efficiently.

While the present embodiment illustrates a translation of the air flow in the y-z plane, other embodiments are well suited to redirecting air flow both in the x-y plane and the y-z plane. This is accomplished by incorporating the linearly shaped and curvilinearly shaped fins of FIGS. 2A, 2B, 3A, 3B, and 4, or a combination thereof, with the curvilinear shape of FIG. 5.

The advantages of the plurality of fins 520 are similar to the fin design of the plurality of fins 220, 320, and 420. By designing a heat sink with an additional feature of air flow direction, no additional parts are necessary within the design of the electrical system in a chassis. For example, no additional baffling is required to redirect air flow through the chassis. Instead, by providing the plurality of fins of a heat sink with the additional feature of air flow redirection, more and more processors can be placed within a particularly sized chassis (e.g., a 1U chassis). Also, space is gained by providing the plurality of fins that provide heat dissipation and air flow redirection, so that, the overall size of an electronic system, and the chassis that houses the electronic system is decreased.

Figure 6A:
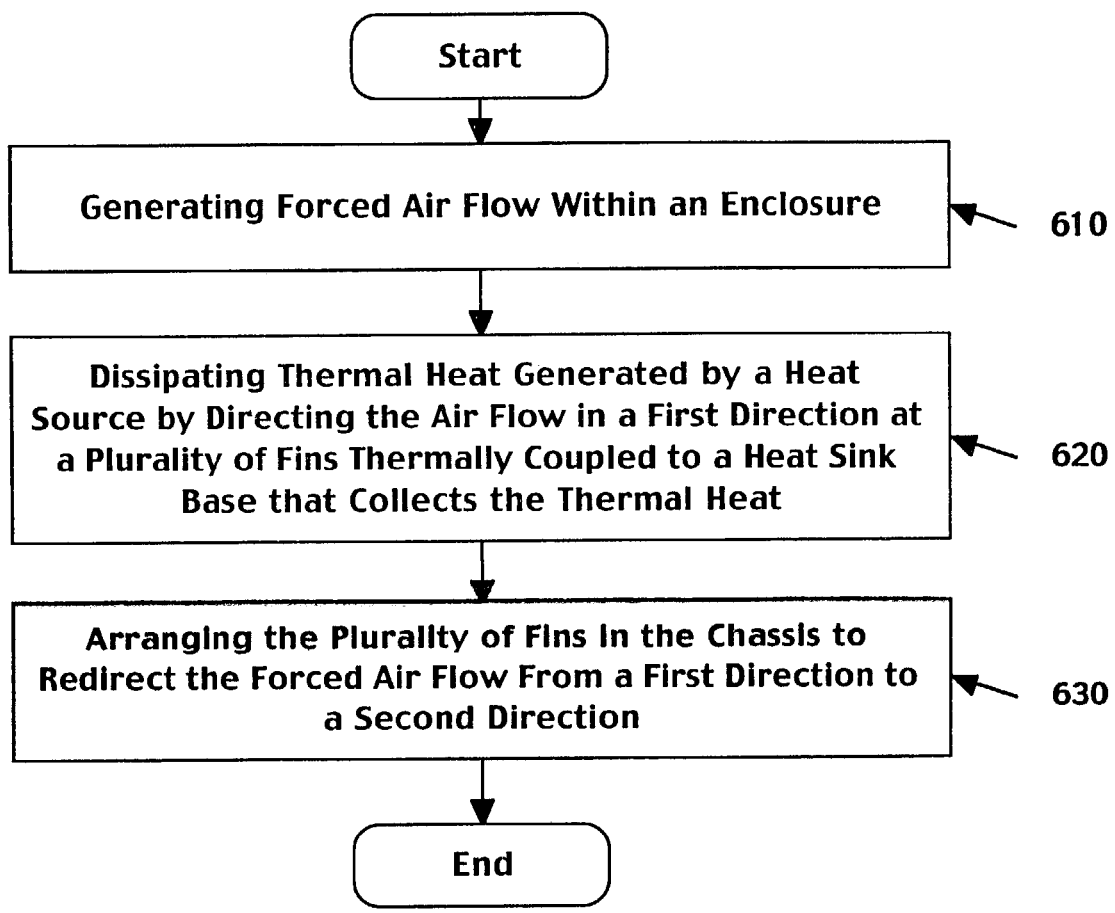
FIG. 6A is a flow chart illustrating steps in a method for redirecting air flow for heat dissipation, in accordance with one embodiment of the present invention.

FIG. 6A is a flow chart 600A illustrating steps in a method for heat dissipation in a chassis housing an electronic system, in accordance with one embodiment of the present invention. The method of flow chart 600A is implemented within a densely packed chassis, in one embodiment to preserve space and utilize components more efficiently in cooling the electrical components in the chassis.

The method of the present embodiment begins by generating forced air flow within an enclosure, in 610. The forced air flow is generated from an air accelerator that is enclosed within the enclosure, such as, a fan. The enclosure is a chassis that houses an electrical system, such as, a server computer chassis. The chassis, in one embodiment, is a densely packed chassis in the z-direction, and has 1U dimensions or smaller.

At 620, the present embodiment dissipates thermal heat generated by a heat source within the enclosure by directing air flow at a plurality of fins. The heat source is a processor, such as, a CPU, in one embodiment. The heat source is thermally coupled to a heat sink base that collects the thermal heat generated by the heat source. Each of the plurality of fins is thermally coupled to the heat sink base for dissipating the thermal heat generated by the heat source. The present embodiment directs the air flow in a first direction at the plurality of fins that is thermally coupled to the heat sink base that collects the thermal heat.

At 630, the present embodiment continues by arranging the plurality of fins in the chassis and in relation to the first direction to redirect the forced air flow from the first direction to a second direction. In one embodiment, the air flow is redirected to the second direction, such that, the second direction varies from the first direction in two dimensions. In another embodiment, the air flow is redirected to the second direction, such that, the second direction varies from the first direction in three dimensions.

Figure 6B:
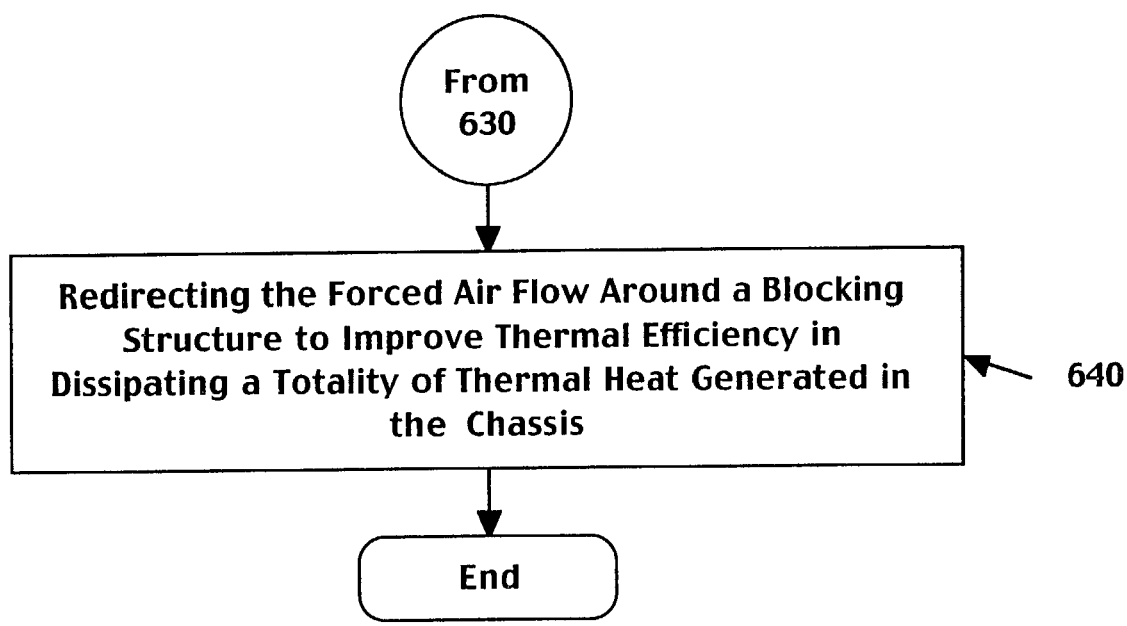
FIG. 6B is a flow chart illustrating steps in a method for redirecting air flow for heat dissipation around a barrier structure, in accordance with one embodiment of the present invention.

FIG. 6B is a flow chart 600B illustrating a continuation of the flow chart 600A of the method for heat dissipation in a chassis housing an electronic system, in accordance with one embodiment of the present invention. The present embodiment continues from 630 by redirecting the forced air flow around a barrier structure to improve efficiency in dissipating a totality of thermal heat generated in the chassis.

Figure 6C:
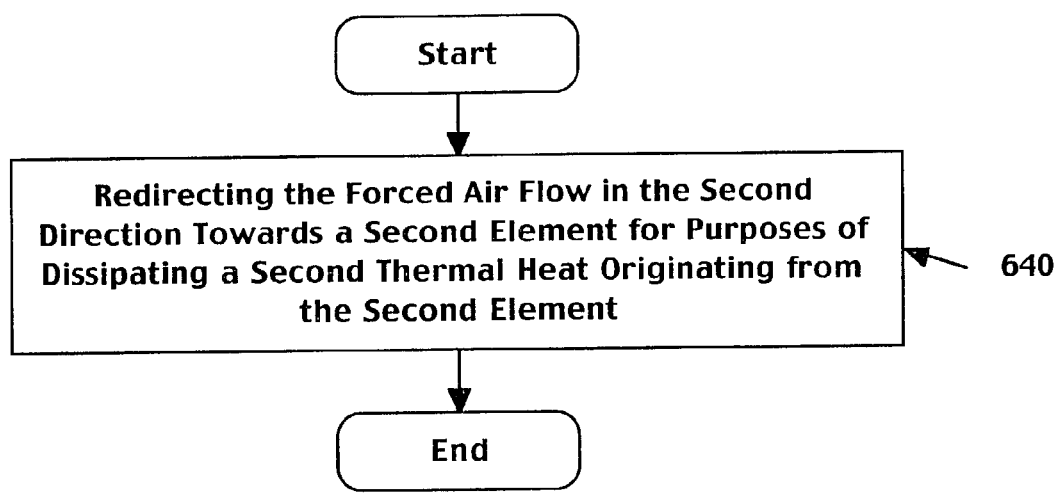
FIG. 6C is a flow chart illustrating steps in a method for redirecting air flow for heat dissipation originating from a remote heat source, in accordance with one embodiment of the present invention.
Figure 1:
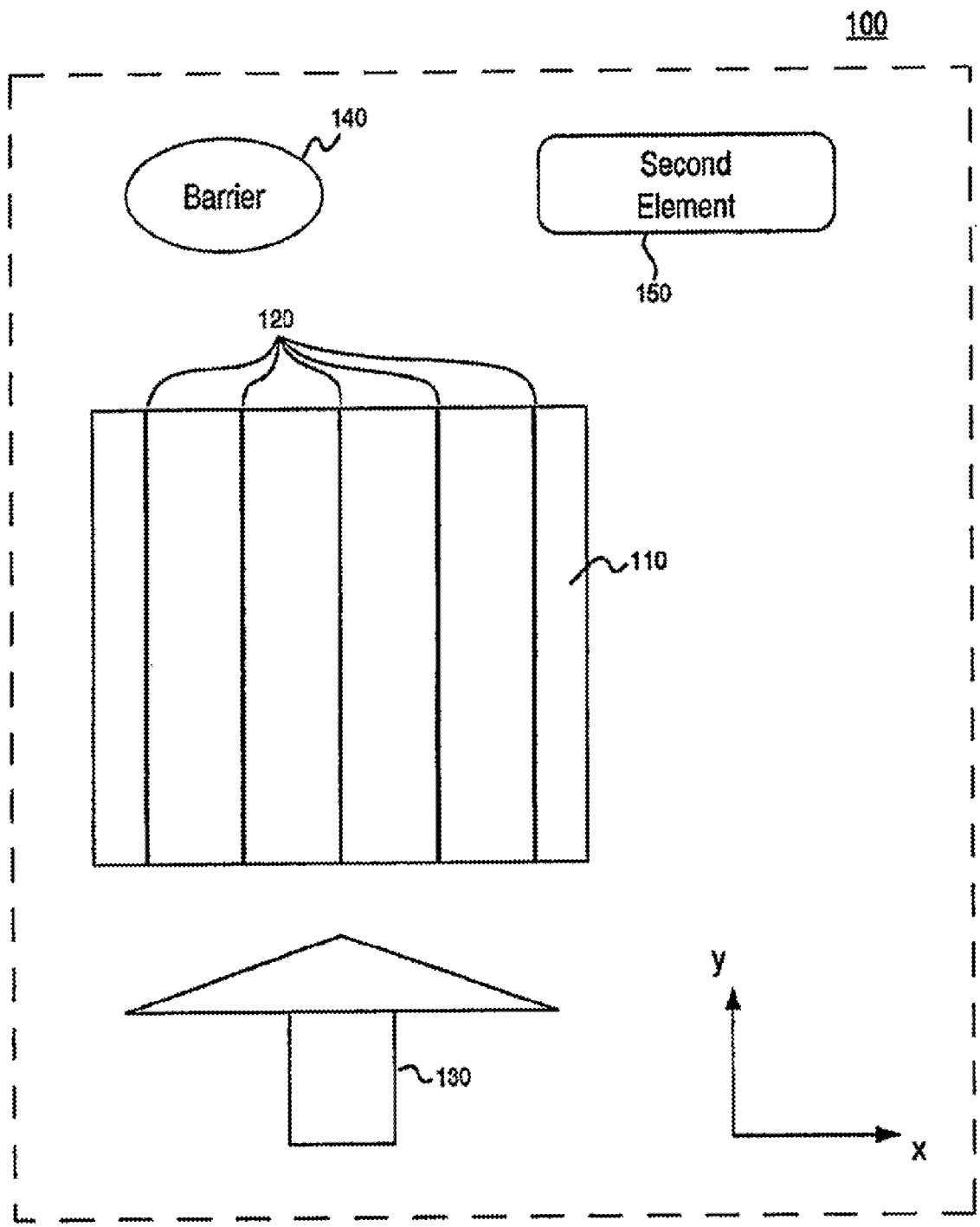
Figure 2A:
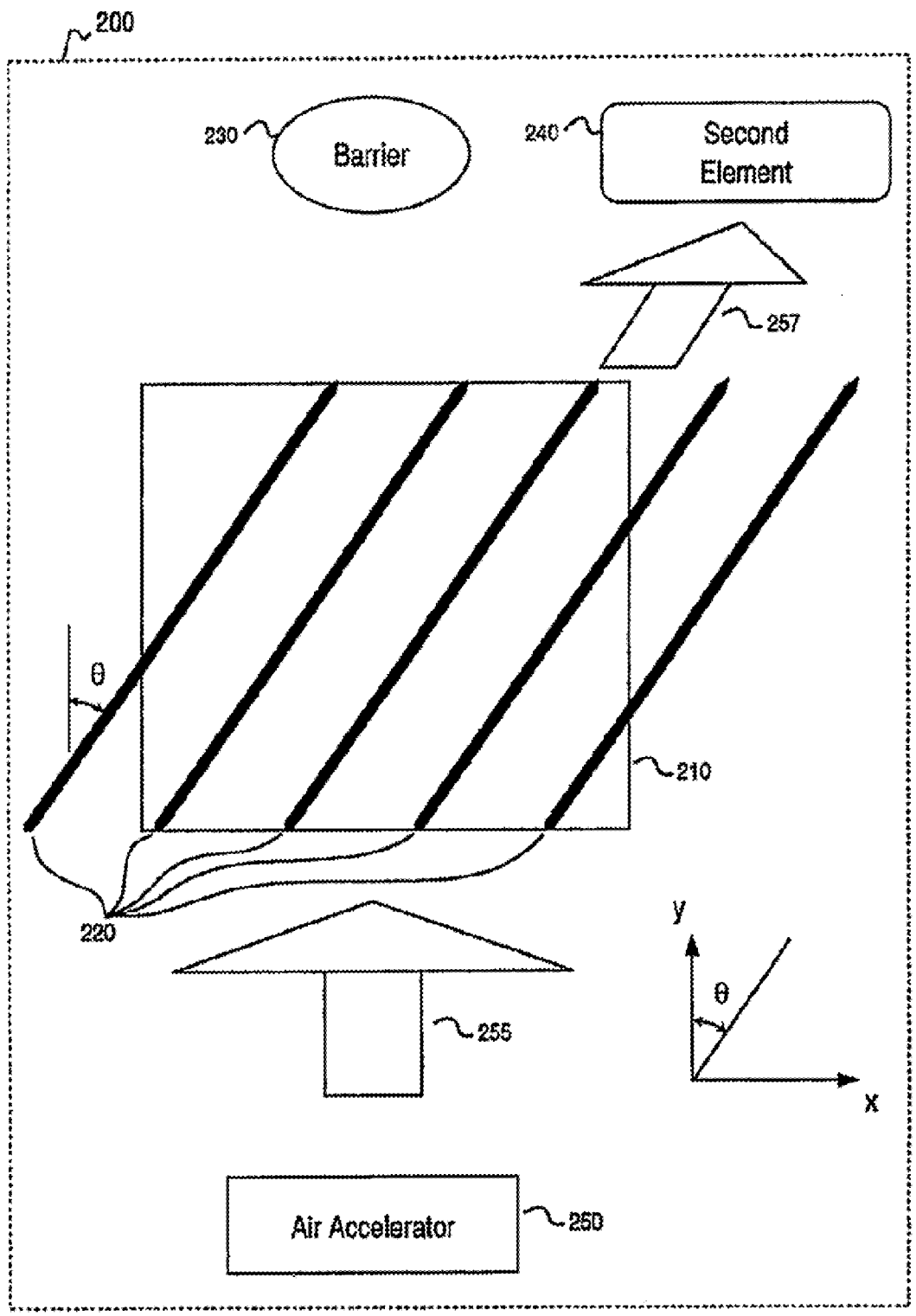
Figure 2B:
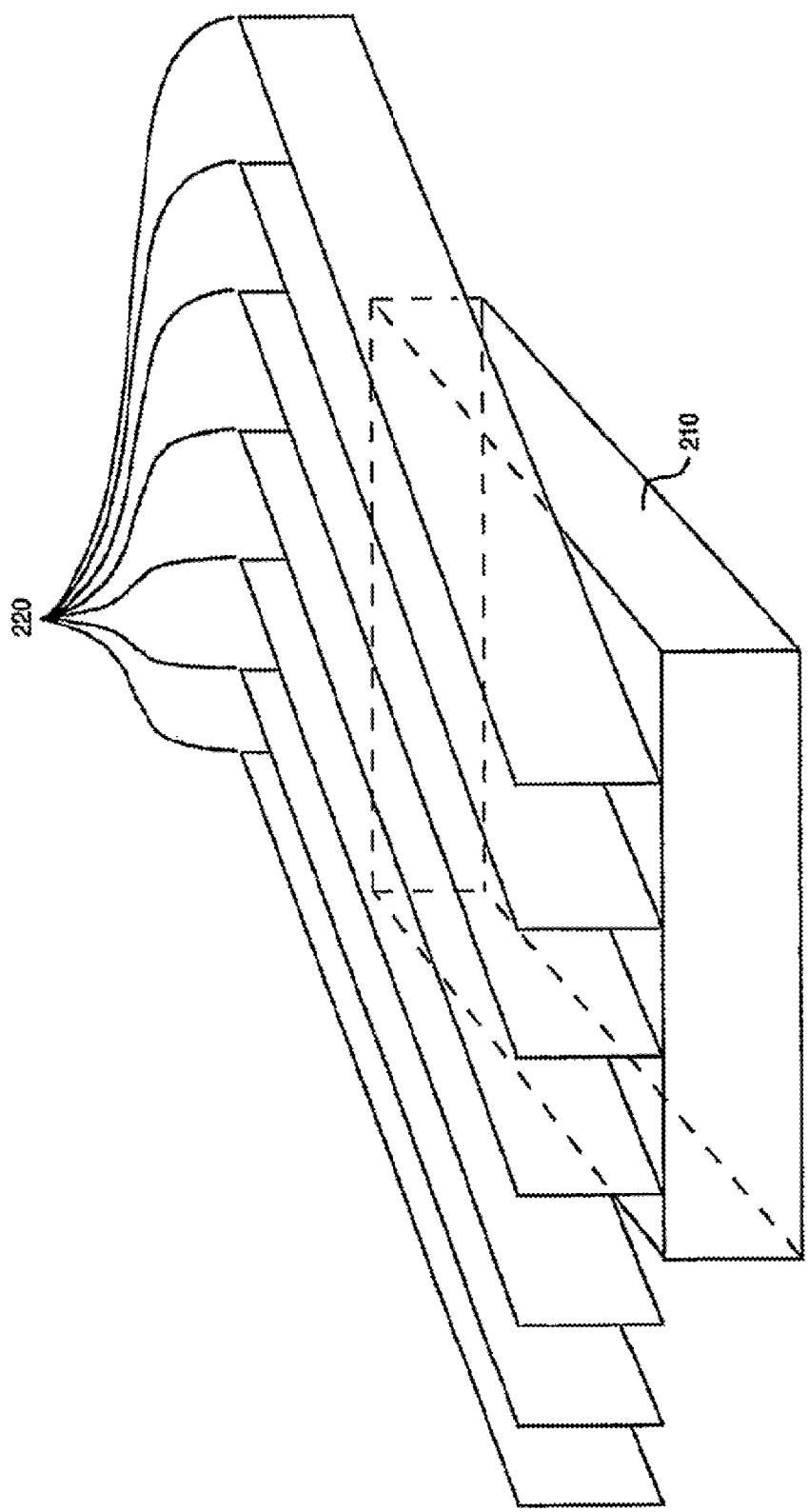
Figure 3A:
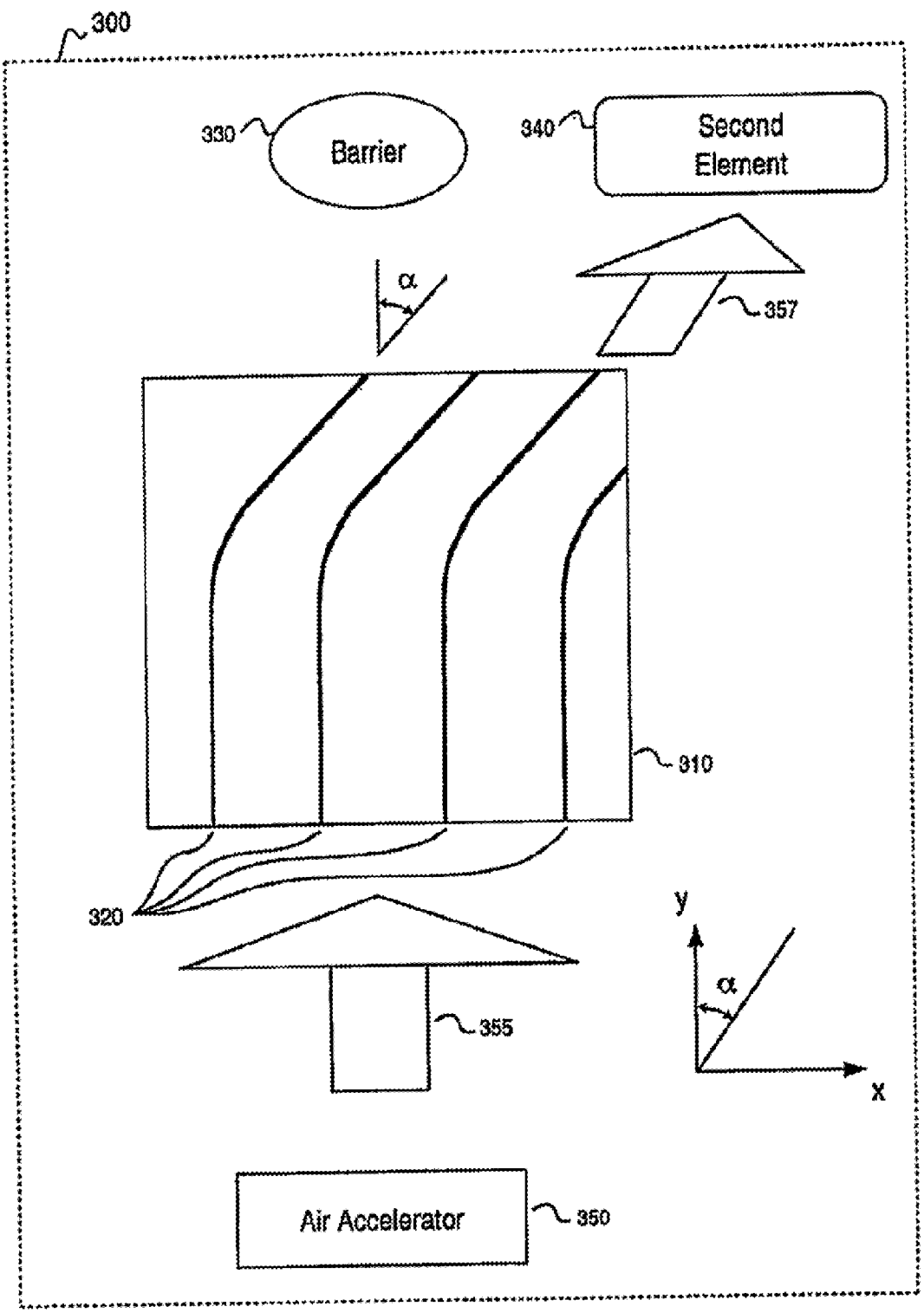
Figure 3B:
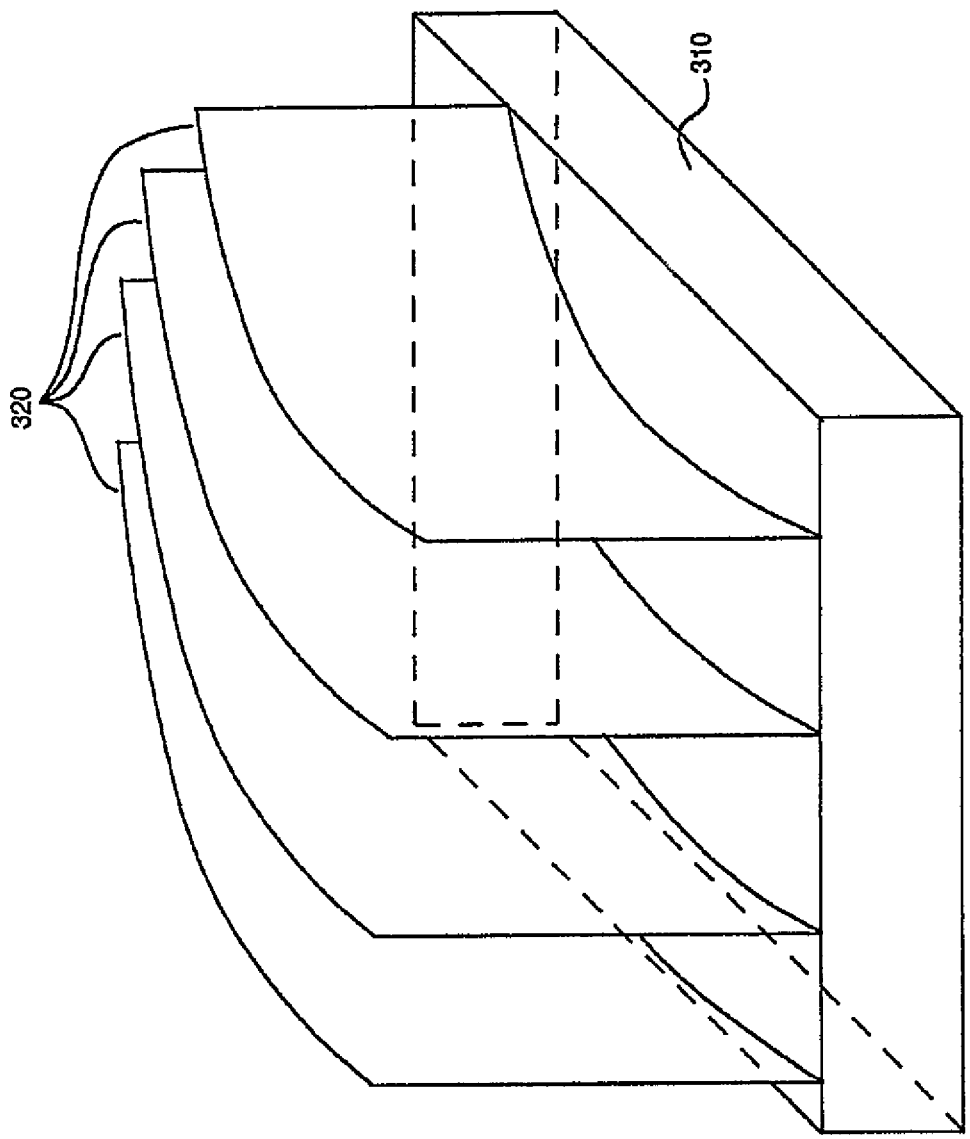
Figure 4:
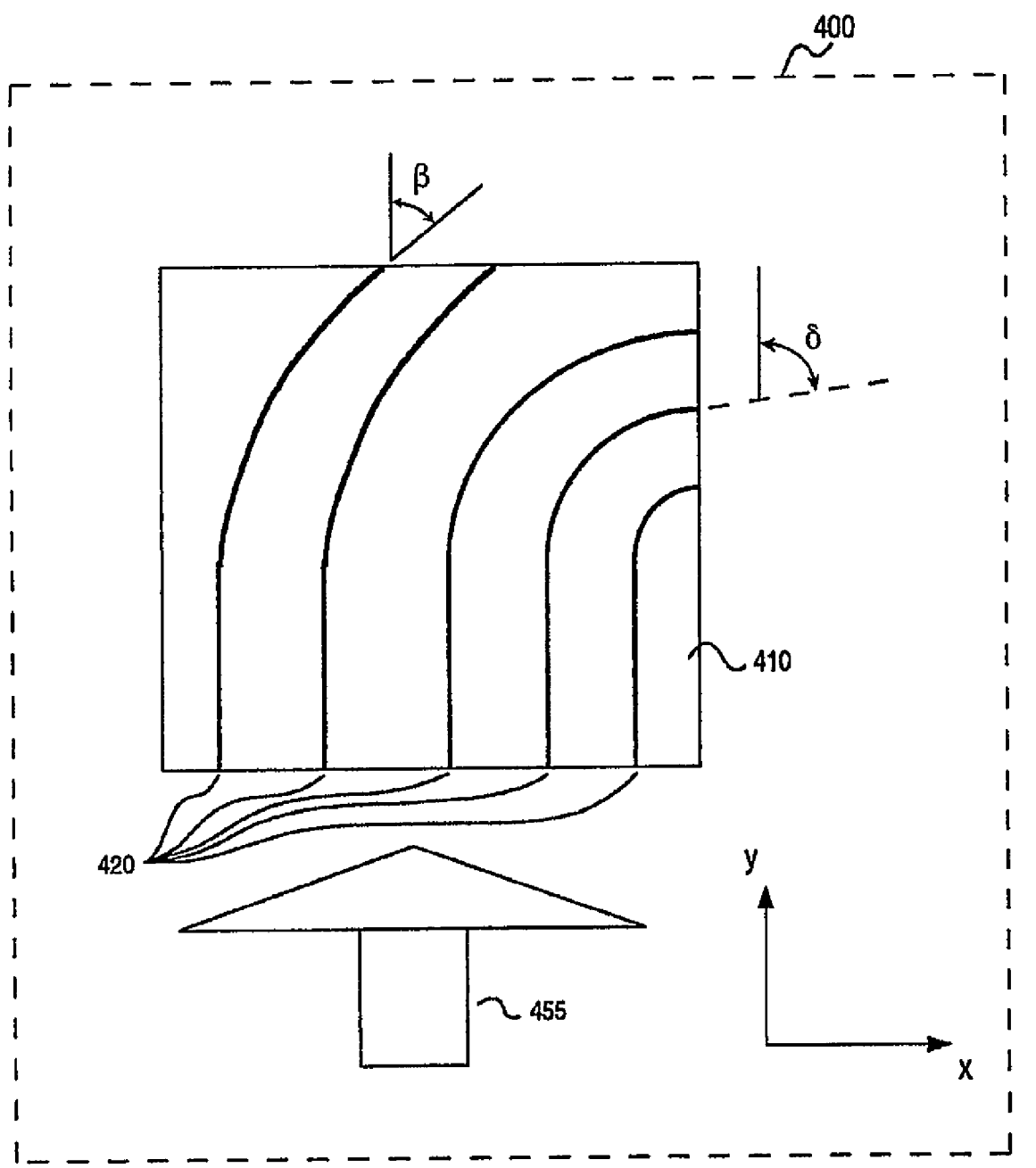
Figure 5:
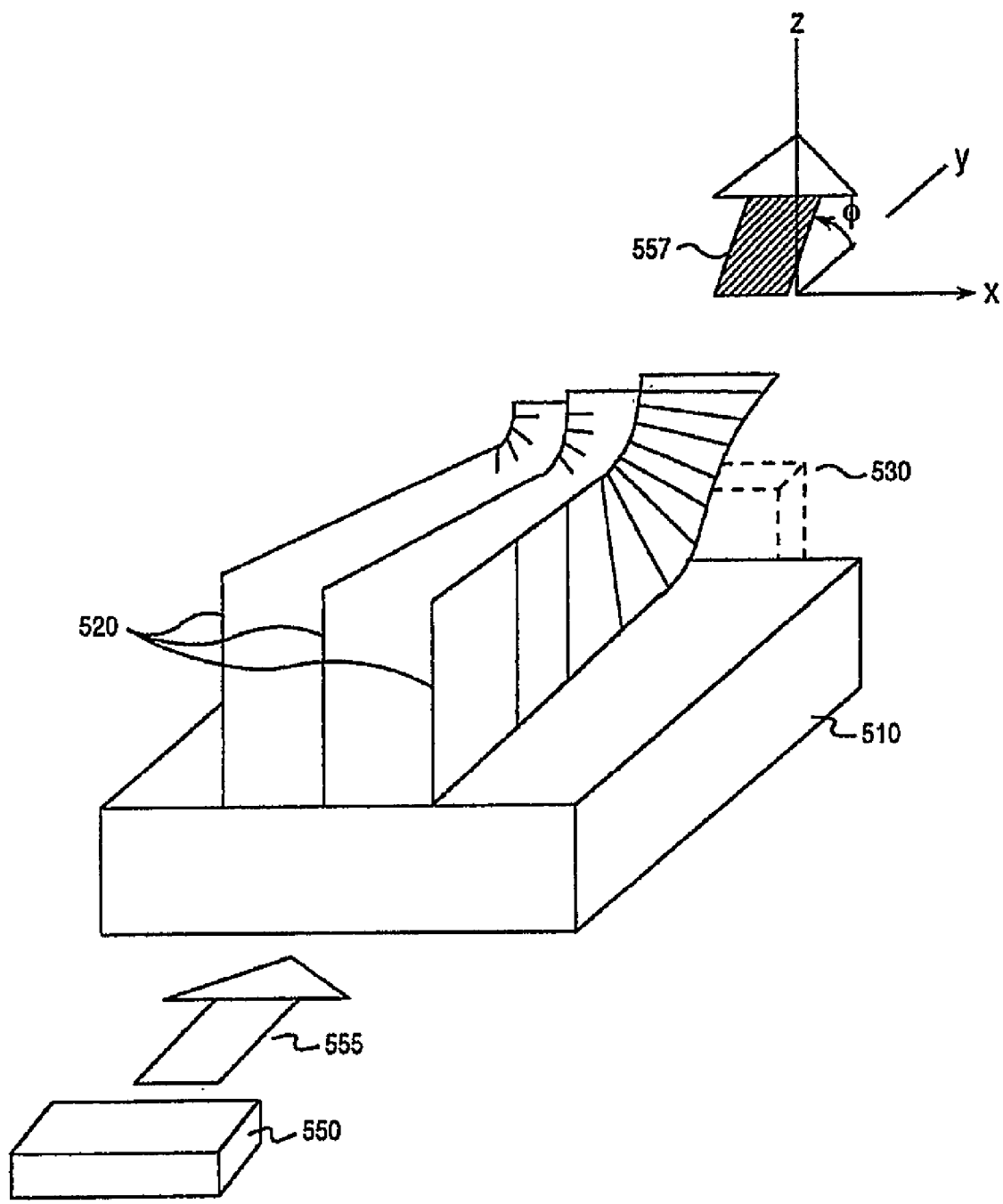
Figure 6A:
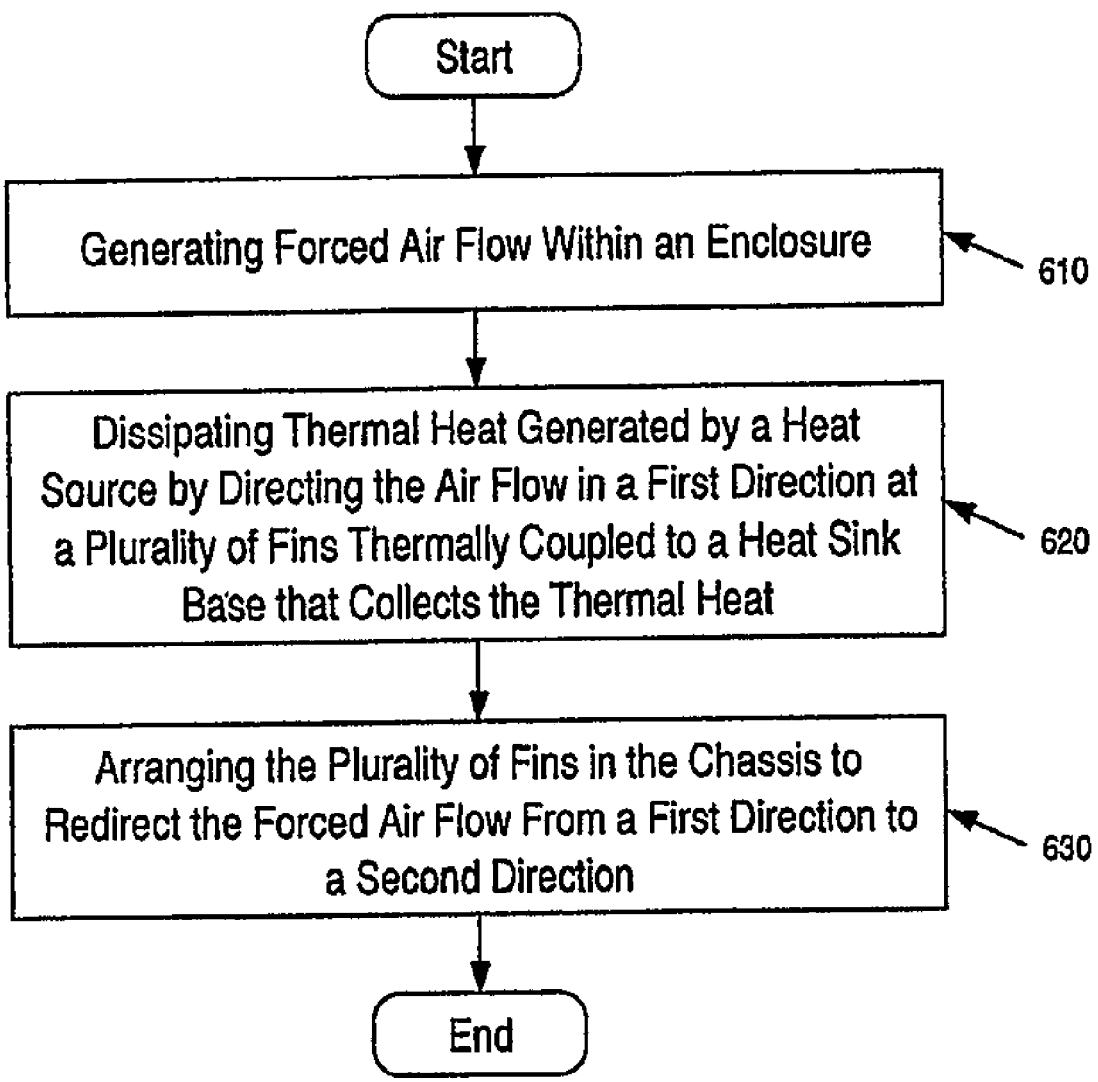
Figure 6B:
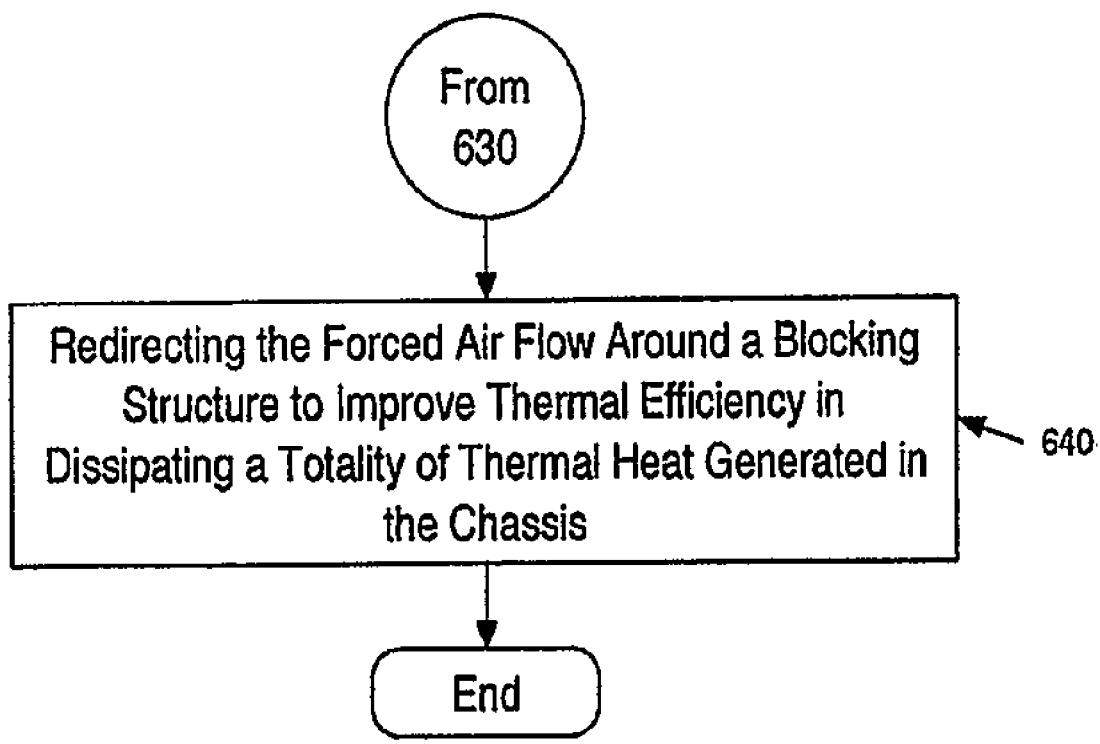
Figure 6C:
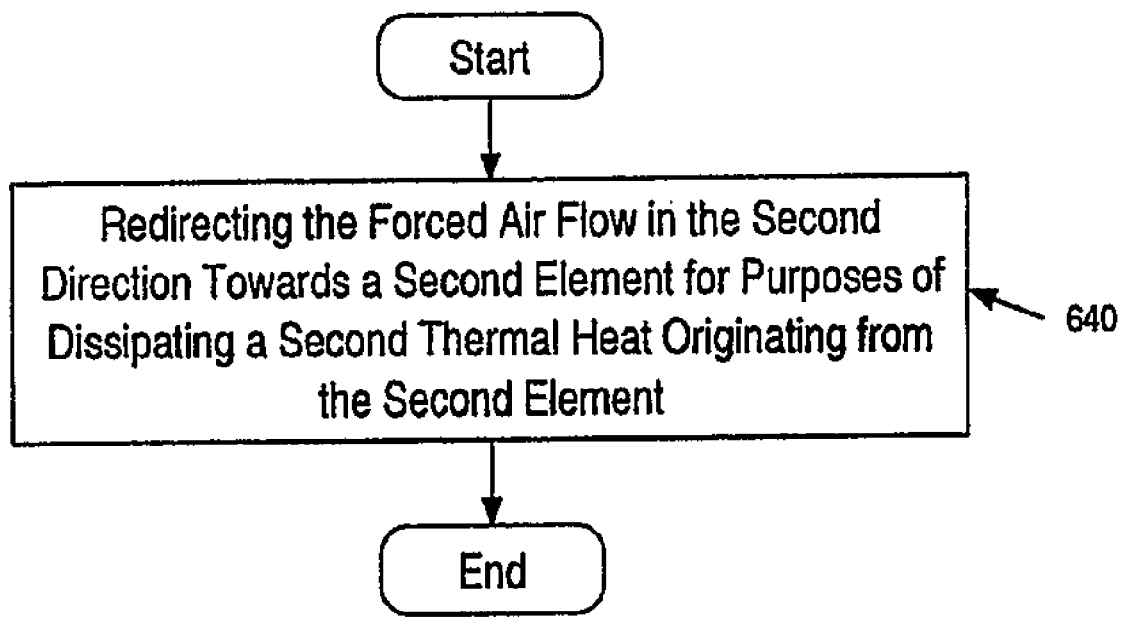

FIG. 6C is a flow chart 600c illustrating a continuation of the flow chart 600A of the method for heat dissipation in a chassis housing an electronic system, in accordance with one embodiment of the present invention. The present embodiment continues from 630 by redirecting the forced air flow in the second direction towards a second element for purposes of dissipating thermal heat originating from the second element. The second element, for example, is a second CPU providing additional services of the electronic system in the chassis.

While the methods of embodiments illustrated in flow charts 600A, 600B, and 600C show specific sequences and quantity of steps, the present invention is suitable to alternative embodiments. For example, not all the steps provided for in the methods are required for the present invention. Furthermore, additional steps can be added to the steps presented in the present embodiment. Likewise, the sequences of steps can be modified depending upon the application.

The preferred embodiments of the present invention, a system and method for heat dissipation and the redirection of air flow within a chassis housing an electrical system, is thus described. While the present invention has been described in particular embodiments, it should be appreciated that the present invention should not be construed as limited by such embodiments, but rather construed according to the below claims.

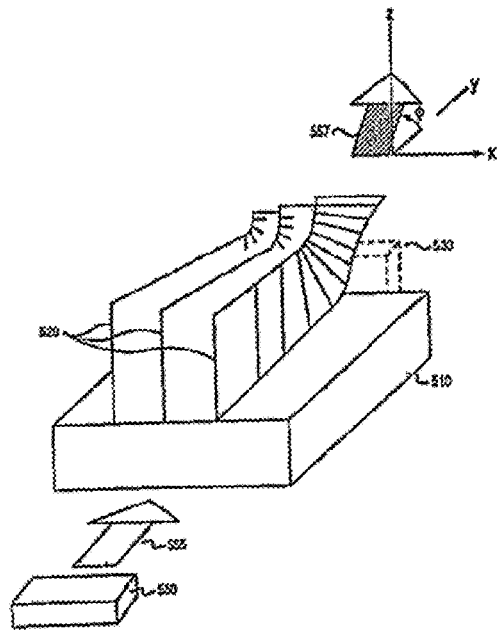

What is claimed is:

1. An apparatus for heat dissipation in a chassis housing an electronic system, comprising:
    a heat sink base for collecting thermal heat; and
    a plurality of curvilinearly shaped fins thermally coupled to said heat sink base for dissipating said thermal heat, said plurality of curvilinearly shaped fins arranged in said chassis to redirect air flow from a first direction originally directed at said plurality of curvilinearly shaped fins to a second direction that is uniform, wherein said second direction varies from said first direction in an x-direction, a y-direction, and a z-direction.

2. The apparatus as described in claim 1, further comprising:
    an air accelerator enclosed within said chassis for providing said air flow in said first direction.

3. The apparatus as described in claim 1, wherein each of said plurality of curvilinearly shaped fins has a substantially linear shape such that each of said plurality of curvilinearly shaped fins is arranged substantially at an angle to said first direction for redirecting said air flow to said second direction.

4. The apparatus as described in claim 1, wherein each of said plurality of curvilinearly shaped fins
    is arranged on said heat sink base to gradually redirect said air flow from said first direction to said second direction.

5. The apparatus as described in claim 1, wherein said second direction varies from said first direction in a three dimensional space.

6. The apparatus as described in claim 1, further comprising:
    a plurality of fins, including said fin, thermally coupled to said heat sink base for dissipating said thermal heat, each of said plurality of fins arranged on said heat sink base to redirect said air flow.

7. An apparatus for heat dissipation enclosed within a chassis, comprising:

a heat source emanating thermal heat;

a heat sink base thermally coupled to said heat source for collecting said thermal heat;

an air accelerator for generating forced air flow;

a plurality of curvilinearly shaped fins thermally coupled to said heat sink base for dissipating said thermal heat, each of said plurality of curvilinearly shaped fins arranged within said chassis to redirect said forced air flow from a first direction originally directed at said plurality of curvilinearly shaped fins to a second direction, wherein said second direction varies from said first direction in an x-direction, a y-direction, and a z-direction, and wherein said plurality of curvilinearly shaped fins is arranged to redirect said forced air flow to bypass a blocking structure.

8. The apparatus as described in claim 7, wherein said heat source is a central processing unit.

9. The apparatus as described in claim 7, wherein said chassis houses an electrical system.

10. The apparatus as described in claim 7, wherein said chassis comprises an 1U server chassis.

11. The apparatus as described in claim 7, wherein said plurality of curvilinearly shaped fins is arranged to redirect said forced air flow towards a second element for purposes of dissipating a second thermal heat originating from said second element.

12. A method for heat dissipation in a chassis housing an electronic system, comprising:

a) generating forced air flow within an enclosure;

b) dissipating thermal heat generated by a heat source by directing said forced air flow in a first direction at a plurality of curvilinearly shaped fins that is thermally coupled to a heat sink base, wherein said heat sink base is thermally coupled to said heat source and collects said thermal heat; and c) arranging said plurality of curvilinearly shaped fins in said chassis to redirect said forced air flow from said first direction to a second direction to bypass a blocking structure, wherein said second direction varies from said first direction in an x-direction, a y-direction, and a z-direction.

13. The method as described in claim 12, wherein c) further comprises:

uniformly varying said first direction from said second direction in a three dimensional space.

* * * * *

UNITED STATES PATENT AND TRADEMARK OFFICE
CERTIFICATE OF CORRECTION

| | | |
|---|---|---|
| PATENT NO. | : 7,079,390 B2 | |
| APPLICATION NO. | : 10/456671 | |
| DATED | : July 18, 2006 | |
| INVENTOR(S) | : Andrew Harvey Barr | |

It is certified that error appears in the above-identified patent and that said Letters Patent is hereby corrected as shown below:

The Title Page, showing an illustrative figure, should be deleted and substitute therefor the attach tile page.

Delete drawings sheet 1-10 and substitute therefor the drawing sheets, consisting of figs. 1-6C as shown on the attached page.

Signed and Sealed this

Seventeenth Day of July, 2007

JON W. DUDAS
*Director of the United States Patent and Trademark Office*

(12) United States Patent
Barr et al.

(10) Patent No.: US 7,079,390 B2
(45) Date of Patent: Jul. 18, 2006

(54) SYSTEM AND METHOD FOR HEAT DISSIPATION AND AIR FLOW REDIRECTION IN A CHASSIS

(75) Inventors: Andrew Harvey Barr, Roseville, CA (US); Stephen Karl Barsun, Davis, CA (US); Robert William Dobbs, Granite Bay, CA (US)

(73) Assignee: Hewlett-Packard Development, L.P., Houston, TX (US)

(*) Notice: Subject to any disclaimer, the term of this patent is extended or adjusted under 35 U.S.C. 154(b) by 219 days.

(21) Appl. No.: 10/456,671

(22) Filed: Jun. 5, 2003

(65) Prior Publication Data
US 2004/0245676 A1 Dec. 9, 2004

(51) Int. Cl.
H05K 7/20 (2006.01)

(52) U.S. Cl. .................. 361/690; 361/697; 361/703; 165/80.3; 257/697

(58) Field of Classification Search .......... 361/683, 361/687–699, 702–712, 717–719, 722–724, 361/756, 775; 257/697, 706–727; 165/80.2, 165/80.3, 121–126, 104.33, 104.34, 165, 165/185; 454/184; 174/16.03, 252, 16.3, 174/16.1, 15.1, 15.2
See application file for complete search history.

(56) References Cited

U.S. PATENT DOCUMENTS

| | | | | |
|---|---|---|---|---|
| 3,592,260 A | * | 7/1971 | Berger | 165/121 |
| 4,733,293 A | * | 3/1988 | Gabuzda | 237/697 |
| 5,090,254 A | * | 3/1991 | Williams | 165/85 |
| 5,582,240 A | * | 12/1996 | Widmayer | 165/80.3 |
| 5,785,116 A | * | 7/1998 | Wagner | 165/80.3 |
| 6,113,485 A | * | 9/2000 | Marquis et al. | 454/184 |
| 6,196,300 B1 | * | 3/2001 | Checchetti | 165/80.3 |
| 6,418,020 B1 | * | 7/2002 | Lin | 361/703 |
| 6,421,239 B1 | * | 7/2002 | Huang | 361/656 |
| 6,657,862 B1 | * | 12/2003 | Crocker et al. | 361/697 |
| 6,671,172 B1 | * | 12/2003 | Carter et al. | 361/697 |
| 6,698,511 B1 | * | 3/2004 | DiBene et al. | 165/185 |
| 6,778,390 B1 | * | 8/2004 | Michael | 361/695 |
| 6,847,525 B1 | * | 1/2005 | Smith et al. | 361/703 |
| 2002/0046826 A1 | * | 4/2002 | Kao | 165/104.33 |
| 2002/0170702 A1 | * | 11/2002 | Ito | 165/80.2 |

FOREIGN PATENT DOCUMENTS

| EP | 1 203 346 A1 | * | 2/2002 |
| JP | 01133338 A | * | 5/1989 |
| JP | 10012781 A | * | 6/1996 |

* cited by examiner

*Primary Examiner*—Michael Datskovskiy

(57) ABSTRACT

An apparatus for heat dissipation in a chassis housing an electronic system, and a method for implementing the same. The apparatus comprises a heat sink base for collecting thermal heat. The apparatus further comprises a fin thermally coupled to the heat sink base for dissipating the thermal heat. The fin is arranged in the chassis to direct air flow from a first direction, that is originally directed at said fin, to a second direction.

13 Claims, 10 Drawing Sheets